United States Patent [19]

Matsui et al.

[11] Patent Number: 4,619,431
[45] Date of Patent: Oct. 28, 1986

[54] APPLIANCE FOR FIXING ELECTRONIC DISPLAY BOARD

[75] Inventors: Kazuhiro Matsui, Toyoake; Haruyuki Sugiura, Kariya, both of Japan

[73] Assignee: Kitagawa Industries Co., Ltd., Nagoya, Japan

[21] Appl. No.: 679,070

[22] Filed: Dec. 6, 1984

[30] Foreign Application Priority Data

Dec. 16, 1983 [JP] Japan .................. 58-194784[U]

[51] Int. Cl.⁴ .......................................... F16M 13/00
[52] U.S. Cl. .................. 248/500; 248/221.4; 248/316.1; 350/334; 368/242
[58] Field of Search .............. 248/73, 71, 74.1, 74.5, 248/27.1, 27.3, 220.2, 221.3, 221.4, 231.9, 309.1, 316.1, 500, 505; 350/334; 361/400, 346, 417, 419; 339/17 C, 17 F, 125 R; 24/297, 573; 368/242

[56] References Cited

U.S. PATENT DOCUMENTS

| 3,058,714 | 10/1962 | Oliver | 248/316.1 |
| 3,080,140 | 3/1963 | Gohs | 248/74.1 |
| 3,501,117 | 3/1970 | Soltysik | 248/221.4 |
| 3,996,500 | 12/1976 | Coules | 248/220.2 |
| 4,012,117 | 3/1977 | Lazzery | 350/334 |
| 4,139,755 | 2/1979 | Hastings | 248/27.1 |
| 4,264,047 | 4/1981 | Nelson | 248/73 |
| 4,422,728 | 12/1983 | Andreaggi | 350/334 |
| 4,457,482 | 7/1984 | Kitagawa | 248/73 |
| 4,467,988 | 8/1984 | Kraus | 248/74.1 |
| 4,515,440 | 5/1985 | Mosier | 350/334 |

FOREIGN PATENT DOCUMENTS 871021  3/1953  Fed. Rep. of Germany ..... 248/74.1

Primary Examiner—J. Franklin Foss
Assistant Examiner—Robert A. Olson
Attorney, Agent, or Firm—Oblon, Fisher, Spivak, McClelland & Maier

[57] ABSTRACT

The present invention provides an appliance for fixing an electronic display board, comprising a body of a flat plate-like support structure, elastic retaining members adjacent to both ends in the longitudinal direction of the fixing appliance body through thin-walled connections, the elastic retaining members being bendable through the thin-walled connections to hold the electronic display board on the surface of the fixing appliance body, pawl retaining pieces adapted to engage pawls of the elastic retaining members, and snaps projecting from the back of the fixing appliance body and adapted to be inserted into fixing holes formed in a chassis substrate to fix the fixing appliance body to the substrate in a spaced relation to each other, and further having leg portions capable of being fixed to the substrate, thereby permitting the electronic display board to be firmly held in place.

7 Claims, 7 Drawing Figures

APPLIANCE FOR FIXING ELECTRONIC DISPLAY BOARD

BACKGROUND OF THE INVENTION

1. Field of the Invention

The present invention relates to an appliance for fixing an electronic display board, capable of easily mounting and fixing the board stably.

2. Description of the Prior Art

An electronic display board utilizing liquid crystal or a fluorescent display tube for numerically or graphically displaying sound volume, frequency, number of revolutions, time, measurements, etc. is attached to household electric appliances and measuring instruments such as a television, radio, video tape recorder, microwave range and stereo. Various methods for mounting such electronic display boards into electric appliances have been proposed. In all of those methods, however, the positional stability after mounting is unsatisfactory and the mounting operation is troublesome and takes time, and thus those methods are very inefficient when viewed from the aspect of production of electric appliances. For example, FIG. 7 is a schematic sectional view showing an example of a conventional mounting method, in which a double-coated tape or adhesive 14 is adhered onto a printed substrate 13, then a buffer material 15 such as, for example, a sponge made of chloroprene is stuck onto the tape or adhesive 14, further, a double-coated tape or adhesive 16 is adhered to the buffer material 15, and the back of an electronic display board 2 is fixed adhesively to the tape or adhesive 16, while terminals 17 extending from the electronic display board 2 are inserted into through holes formed in the printed substrate 13 to support the board 2. In such fixing method, however, the application of the adhesive and the removal of a release paper from the double-coated tape are troublesome, and particularly when an adhesive is used, its drying takes time. Further, it is difficult to dispose the electronic display board in a predetermined position. The board is apt to be dislocated, and its terminals are easily bent under a one-sided load imposed thereon, and so are difficult to be inserted into the through holes formed in the printed substrate. Also for maintenance, various drawbacks are involved in such fixing method, for example, the electronic display board once mounted is difficult to remove, and the height is not stabilized.

SUMMARY OF THE INVENTION

It is an object of the present invention to provide an appliance for fixing an electronic display board, extremely convenient as an electric appliance assembling member, capable of mounting and fixing the board in an electric appliance easily and stably without bending of terminals because of no load imposed thereon.

It is another object of the present invention to provide an electronic display board fixing appliance of a plate-like support structure capable of holding the board firmly, having leg portions which permits the board to be fixed to a chassis substrate.

The gist of the present invention resides in an electronic display board fixing appliance of a flat plate-like support structure provided at both longitudinal ends thereof with elastic bendable retaining members for holding an electronic display board on the support plate through thin-walled connections, also provided at both end portions of its longitudinally extending edges with pawl retaining pieces adapted to engage pawls of the elastic retaining members, and further provided projectingly at the back thereof with snaps adapted to be fitted in fixing holes formed in a substrate to fix the display board to the substrate at a predetermined spacing.

DESCRIPTION OF A PREFERRED EMBODIMENT

An embodiment of the present invention will be described hereinafter with reference to the drawings.

Figure 1:
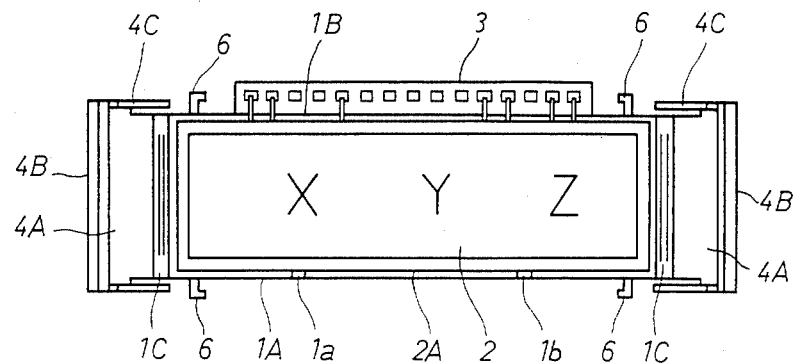
FIG. 1 is a plan view of an electronic display board fixing appliance according to an embodiment of the present invention.
Figure 2:
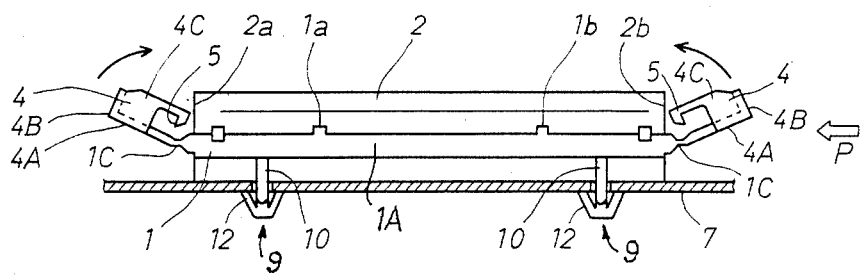
FIG. 2 is a front view thereof.
Figure 3:
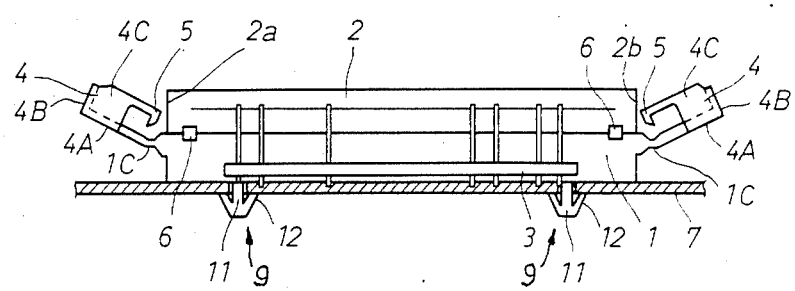
FIG. 3 is a rear view thereof.
Figure 4:
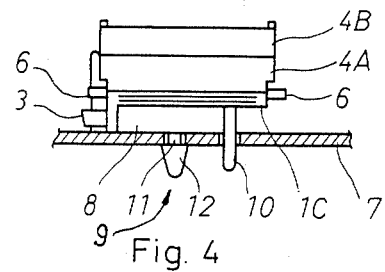
FIG. 4 is a side view taken in the direction of an arrow of FIG. 2.
Figure 5:
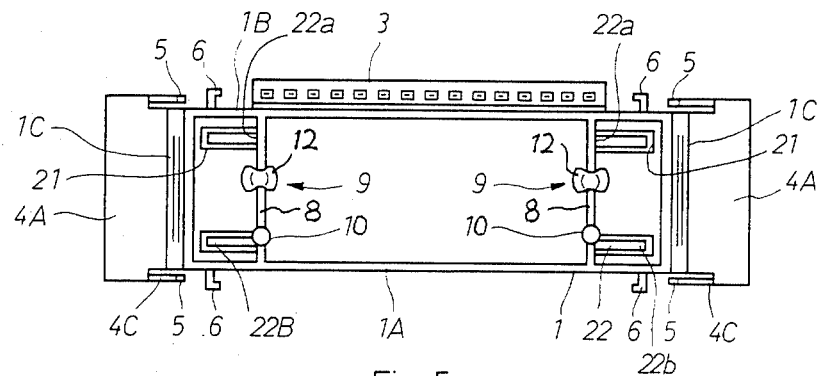
FIG. 5 is a bottom view.

FIG. 1 is a plan view, FIG. 2 is a front view, FIG. 3 is a rear view, FIG. 4 is a side view taken in the direction of arrow P in FIG. 2, and FIG. 5 is a bottom view.

Figure 6:
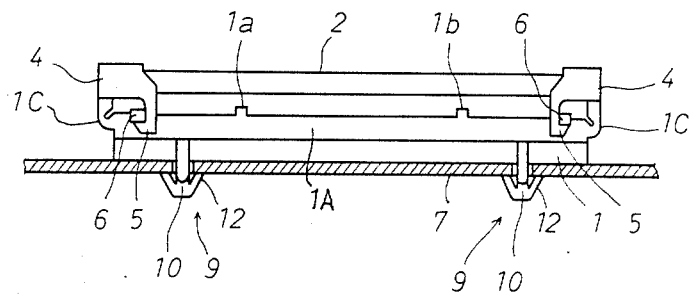
FIG. 6 is a front view showing a state of use.
Figure 7:
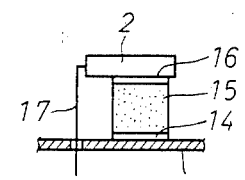
FIG. 7 is a schematic sectional view showing a conventional fixing method.

In these figures, the reference numeral 1 denotes a fixing appliance body formed of a synthetic resin. The fixing appliance body 1 is of a plate-like structure having a flat surface for putting thereon an electronic display board 2. On a longitudinally extending edge 1A of the fixing appliance body 1 are projecting lugs 1a for preventing the electronic display board 2 from falling off, the lugs 1a being in contact with a longitudinally extending edge 2A of the electronic display board 2. Further, on and along the opposite edge 1B is integrally formed a terminal holding frame 3 having guide holes for insertion therein of many terminals (lead wires) from the electronic display board 2. On the other hand, at both ends in the longitudinal direction of the fixing appliance body 1 are formed thin-walled portions 1C along the said ends. Contiguous to the thin-walled portions 1C are elastic retaining members 4 which are urged bendably in the directions indicated with arrows. The elastic retaining members 4 are each composed of a bottom frame 4A, a longitudinal frame 4B and side frames 4C. The side frames 4C are each formed with an engaging pawl 5. When the elastic retaining member 4 is bent until the bottom frame 4A stands substantially upright, the engaging pawls 5 come into engagement with pawl retaining pieces 6 which are integrally formed, and projecting sideways from the longitudinally extending edges 1A and 1B of the fixing appliance body, whereby the body of the electric display board 2 is held by the bottom frame 4A, longitudinal frame 4B and side frames 4C at both ends 2a and 2b in the longitudinal direction thereof, and thus fixed firmly onto the surface of the fixing appliance body 1. Therefore, when the electronic display board 2 is fixed, the terminals per se are not loaded. FIG. 6 is a front view showing the fixed state. On the back of the fixing appliance body 1 are provided fixing portions for fixing it stably to, for example, a chassis substrate in an electronic appliance. More particularly, as shown in the side view of FIG. 4 and the bottom view of FIG. 5, reinforcing ribs 8 having a predetermined height are formed in the longitudinal direction of the back of the fixing appliance body 1 so as to maintain a desired vertical spacing from a substrate 7. The ribs 8 are each integrally formed with a snap 9 and a support leg 10. By inserting the snaps 9 and support legs 10 into mounting holes preformed in the substrate 7, the fixing appliance body 1 is supported at a total of four points and thus firmly fixed onto the substrate 7. The snaps 9 shown are each of an anchor type having a shank 11 and a self-locking piece 12 which is projecting outwardly upward from the fore end portion of the shank 11 and which comes into abutment with the back of the substrate 7 when inserted in a mounting hole of the substrate. However, the snaps 9 may be of any other known removable fixing structure.

The numeral 21 denotes a long hole formed in the fixing appliance body 1 at four portions. In each long hole 21 is provided a plate spring 22 having a base portion 22a which is integral with the fixing appliance body 1. The base portion 22a of the plate spring 22 is fixed, while a fore end 22b thereof is urged downward (namely, upwardly perpendicularly to the paper surface in FIG. 5) and thus acts to separate the fixing appliance body 1 from the substrate 7. The fixing appliance body 1 is firmly held in place by cooperation of the plate springs 22 with the snaps 9.

What is claimed is:

1. An appliance for fixing an electronic display board, comprising:
   a flat elongated plate-like support body,
   elastic retaining members connected to said support body by thin-walled connections adjacent to both longitudinal ends of said support body, said elastic retaining members being bendable through said thin-walled connections to a holding position such that an electronic display board on a surface of the fixing appliance body may be held thereon,
   pawl retaining pieces adapted to engage pawls of the elastic retaining members when said elastic retaining members are bent to said holding position,
   snaps projecting from another surface of the support body for fixing said appliance body to a substrate; and
   a terminal holding frame on at least one longitudinally extending edge portion of said support body, the terminal holding frame having terminal guide holes therein.

2. An appliance for fixing an electric display board according to claim 1, including lugs for preventing the electronic display board from falling off said support body, said lugs projecting upward from a longitudinally extending edge portion of said support body, whereby said lugs may contact a portion of an electronic display board mounted on said support body, said terminal holding frame being integrally provided on the other longitudinally extending edge portion of said support body, wherein the elastic retaining members are elastically held contiguous to the thin-walled connections.

3. An appliance for fixing an electric display board according to claim 2, wherein the elastic retaining members each comprise a bottom frame contiguous to the thin-walled connection, a longitudinal frame and side frames, the side frames being formed with said pawls so that said pawls engage said pawl retaining pieces when the elastic retaining member is bent until the bottom frame stands substantially upright, the pawl retaining pieces projecting sideways from the longitudinally extending edge portions of said support body and being integral therewith.

4. An appliance for fixing an electronic display board according to claim 3, including longitudinally extending ribs integrally formed in said other surface of said support body, the reinforcing ribs having a predetermined height, the reinforcing ribs being integrally formed with snaps and support legs, whereby the snaps and the support legs may be inserted into mounting holes of the substrate thereby supporting the fixing appliance body firmly at said predetermined height.

5. An appliance for fixing an electronic display board according to claim 4 including four long holes on said support body, and a plate spring in each of said long holes, each said plate spring having a fixed base portion integral with the support body and a fore end portion.

6. The appliance of claim 5 wherein said elastic retaining members are mutually independent.

7. The appliance of claim 1 wherein said pawl retaining pieces are each positioned on said support body adjacent one longitudinal end of said support body and wherein each of said elastic retaining members are connected to said support body by said thin-walled connections adjacent said one end.

* * * * *